US010763745B2

(12) United States Patent
Lin

(10) Patent No.: US 10,763,745 B2
(45) Date of Patent: Sep. 1, 2020

(54) VARIABLE-FREQUENCY ELECTRIC CHARGE PUMP UNIT, CHIP, AND COMMUNICATION TERMINAL

(71) Applicant: VANCHIP (TIANJIN) TECHNOLOGY CO., LTD., Tianjin (CN)

(72) Inventor: Sheng Lin, Tianjin (CN)

(73) Assignee: VANCHIP (TIANJIN) TECHNOLOGY CO., LTD., Binhai New Area, Tianjin (CN)

(*) Notice: Subject to any disclaimer, the term of this patent is extended or adjusted under 35 U.S.C. 154(b) by 0 days.

(21) Appl. No.: 16/313,707

(22) PCT Filed: Jun. 30, 2017

(86) PCT No.: PCT/CN2017/091343
§ 371 (c)(1),
(2) Date: Dec. 27, 2018

(87) PCT Pub. No.: WO2018/001382
PCT Pub. Date: Jan. 4, 2018

(65) Prior Publication Data
US 2019/0173378 A1   Jun. 6, 2019

(30) Foreign Application Priority Data

Jun. 30, 2016 (CN) .......................... 2016 1 0517822

(51) Int. Cl.
*H02M 3/07* (2006.01)
*G11C 5/14* (2006.01)
*H02M 1/12* (2006.01)
*H02M 1/00* (2006.01)

(52) U.S. Cl.
CPC .............. *H02M 3/07* (2013.01); *G11C 5/145* (2013.01); *H02M 1/12* (2013.01); *H02M 2001/0003* (2013.01)

(58) Field of Classification Search
CPC .. H02M 3/07; H02M 2001/0003; H02M 1/12; G11C 5/145
(Continued)

(56) References Cited

U.S. PATENT DOCUMENTS

2012/0236672 A1* 9/2012 Lee .................. H02M 1/15
365/226
2013/0342180 A1* 12/2013 Zhou .................. H02M 3/07
323/234

FOREIGN PATENT DOCUMENTS

CN          102255497 A      11/2011
CN          202931269 U       5/2013
(Continued)

OTHER PUBLICATIONS

First Office Action and search report from CN app. No. 201610517822.6, dated Jul. 26, 2019, with English translation from Global Dossier.
(Continued)

Primary Examiner — John W Poos
(74) Attorney, Agent, or Firm — Ladas & Parry, LLP

(57) ABSTRACT

A variable-frequency electric charge pump unit, a chip, and a communication terminal. The electric charge pump unit comprises a variable-frequency signal generator, an electric charge pump circuit, and a voltage detector connected in series. The variable-frequency signal generator outputs a clock signal for the electric charge pump circuit. The electric charge pump circuit generates an output voltage on the basis of the clock signal. The output voltage drives a load on the one hand and is connected to the voltage detector on the other hand. An output end of the voltage detector is connected to the variable-frequency signal generator. The working frequency of the variable-frequency signal generator can be adjusted dynamically on the basis of a requirement that
(Continued)

a radiofrequency system work state has on the driving output of the electric charge pump unit.

11 Claims, 4 Drawing Sheets

(58) Field of Classification Search
USPC .......................................................... 327/536
See application file for complete search history.

(56) References Cited

FOREIGN PATENT DOCUMENTS

| CN | 103490624 A | 1/2014 |
|---|---|---|
| CN | 203747776 U | 7/2014 |
| CN | 104541220 A | 4/2015 |
| CN | 105159372 A | 12/2015 |
| CN | 106100320 A | 11/2016 |

OTHER PUBLICATIONS

Second Office Action from CN app. No. 201610517822.6, dated Oct. 31, 2019, with English translation from Global Dossier.
International Search Report from PCT/CN2017/091343, dated Oct. 11, 2017, with English translation from WIPO.
Written Opinion of the International Searching Authority from PCT/CN2017/091343, dated Oct. 11, 2017, with English translation from WIPO.
International Preliminary Report on Patentability from PCT/CN2017/091343, dated Jan. 1, 2019, with English translation from WIPO.

* cited by examiner

VARIABLE-FREQUENCY ELECTRIC CHARGE PUMP UNIT, CHIP, AND COMMUNICATION TERMINAL

CROSS-REFERENCE TO RELATED APPLICATIONS

The present application is the U.S. national phase of PCT Application PCT/CN2017/091343 filed on Jun. 30, 2017, which claims priority to the Chinese patent application No. 201610517822.6 filed on Jun. 30, 2016, the entire disclosures of which are hereby incorporated by reference in their entireties.

BACKGROUND

Technical Field

The present invention relates to a variable-frequency electric charge pump unit, meanwhile to a method for controlling a radio frequency switch using the electric charge pump unit, and further to an integrated circuit chip using the electric charge pump unit and a corresponding communication terminal, and pertains to the field of integrated circuit technologies.

RELATED ART

With continuously upgrade of an integration level of a radio communications system, usage of radio frequency switches increases with each passing day. To ensure that signal noise can still be guaranteed not to degrade after a radio frequency signal passes through a multipath radio frequency switch, increasingly higher requirements are proposed for low noise design of the radio frequency switch.

It is well known that square wave signals may produce harmonic components in a broad frequency band, and therefore it is necessary to avoid use of square wave signals such as clock signals in radio frequency (RF) systems as far as possible. However, in consideration of a requirement of a radio frequency system on isolation between different paths of a radio frequency switch, usually a negative voltage needs to be generated to turn off the radio frequency switch, so as to satisfy the index requirement of the radio frequency system on the isolation between the different paths. In practice, the negative voltage is usually generated by an electric charge pump circuit. The electric charge pump circuit is a common circuit for implementing direct current voltage conversion by matching an external capacitor. Operation of the electric charge pump circuit needs a clock signal. The clock signal inevitably generates a harmonic component in the wide frequency band. This may cause noise interference to the radio frequency system.

FIG. 1 is an exemplary block diagram of a conventional electric charge pump unit and a load of the electric charge pump circuit. A working frequency of the electric charge pump unit is provided by a frequency signal generator, and the electric charge pump circuit directly supplies a converted voltage to the load. In the existing technology, the working frequency is generally a fixed value and cannot satisfy a compromise requirement between a speed and the working frequency. Moreover, the conventional electric charge pump unit cannot actively adjust the working frequency of the circuit based on a load status of the electric charge pump unit. Because the electric charge pump unit works in an open-loop mode, the electric charge pump cannot sense a change in the load of the electric charge pump unit and further cannot adjust the working frequency autonomously.

The invention patent with Chinese Patent No. ZL201310451117.7 discloses a self-adaptive frequency electric charge pump circuit, including: a core electric charge pump structure circuit, an output voltage monitoring circuit, and an oscillation generation circuit. The output voltage monitoring circuit and the oscillation generation circuit are separately connected to the core electric charge pump structure circuit, and the output voltage monitoring circuit is connected to the oscillation generation circuit. In the self-adaptive frequency electric charge pump circuit provided in the present invention, the core electric charge pump structure circuit is configured to store energy and raise a voltage, an output signal of the voltage monitoring circuit generates a corresponding linear change when an output voltage of the electric charge pump circuit changes, and the change in the output signal of the voltage monitoring circuit causes a change in an oscillation generation circuit comparison threshold, to adjust an output voltage of the oscillation generation circuit to a target voltage, thereby reducing power consumption of the electric charge pump circuit.

SUMMARY

A primary technical problem to be resolved by the present invention is to provide a variable-frequency electric charge pump unit.

Another technical problem to be resolved by the present invention is to provide a method for controlling a radio frequency switch using the electric charge pump unit.

Still another technical problem to be resolved by the present invention is to provide an integrated circuit chip using the electric charge pump unit and a corresponding communication terminal.

To achieve the foregoing inventive objectives, the present invention uses the following technical solutions:

According to a first aspect of the embodiments of the present invention, a variable-frequency electric charge pump unit is provided. The variable-frequency electric charge pump unit includes a variable-frequency signal generator, an electric charge pump circuit, and a voltage detector that are sequentially connected, where the variable-frequency signal generator outputs a clock signal to the electric charge pump circuit, the electric charge pump circuit generates an output voltage based on the clock signal, and the output voltage on one hand drives a load and on the other hand is connected to the voltage detector; and an output end of the voltage detector is connected to the variable-frequency signal generator. Preferably, the variable-frequency signal generator dynamically adjusts a working frequency of the clock signal based on an output of the voltage detector.

Preferably, when the load of the electric charge pump unit increases, the working frequency of the variable-frequency signal generator increases correspondingly; and when the load of the electric charge pump unit decreases, the working frequency of the variable-frequency signal generator decreases correspondingly.

Preferably, the variable-frequency signal generator is implemented by a voltage controlled oscillator whose frequency is continuously variable.

Alternatively, the variable-frequency signal generator is implemented by a multipoint frequency selectable oscillator circuit.

Preferably, a frequency point of a multiplied-frequency of the working frequency is prevented from falling on frequency points of harmonics of orders of a fundamental frequency.

Preferably, the electric charge pump circuit raises a gate voltage of a transistor on a path to a voltage level greater than a power supply voltage, to reduce an insertion loss of a radio frequency switch.

Preferably, the electric charge pump circuit generates a negative voltage, to bias off a gate and a substrate of a transistor on a path.

According to a second aspect of the embodiments of the present invention, a method for controlling a radio frequency switch is provided. The method includes the following steps:

generating, by using the foregoing electric charge pump unit, a radio frequency switch control voltage;

detecting, by a voltage detection circuit, a value of the radio frequency switch control voltage; and adjusting a frequency of a clock signal based on an output signal of the voltage detection circuit.

Preferably, an output voltage of the voltage detection circuit varies monotonically and in a same direction with a negative voltage generated by the electric charge pump unit.

Preferably, the frequency of the clock signal continuously varies monotonically and in a same direction with an output voltage of the voltage detection circuit.

Preferably, the frequency of the clock signal discretely varies monotonically and in a same direction with an output voltage of the voltage detection circuit.

Preferably, the output voltage of the voltage detection circuit is a high level or low level logic signal, and the frequency of the clock signal is correspondingly a high frequency or a low frequency.

According to a third aspect of the embodiments of the present invention, a chip having an electric charge pump unit is provided, where the chip includes the foregoing electric charge pump unit.

According to a fourth aspect of the embodiments of the present invention, a communication terminal having an electric charge pump unit is provided, where the communication terminal includes the foregoing electric charge pump unit.

The electric charge pump unit provided in the present invention can dynamically adjust the working frequency of the variable-frequency signal generator on the basis of a requirement that a radio frequency system work state has on driving output of the electric charge pump unit, thus satisfying actual demands for driving the load as required and reducing noise interference to the radio frequency system.

DETAILED DESCRIPTION

Figure 1:
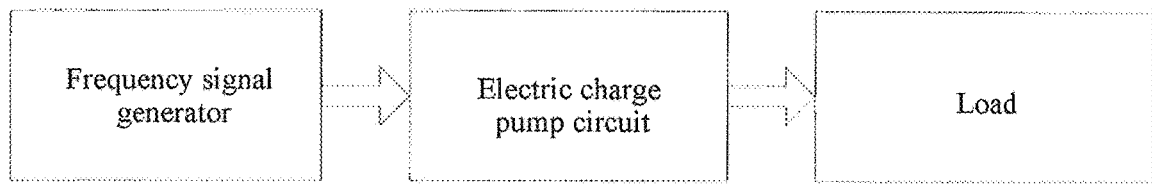
FIG. 1 is an exemplary block diagram of a conventional electric charge pump unit and a load of the electric charge pump unit.

The technical content of the present invention is described in detail below with reference to the accompanying drawings and specific embodiments.

As described above, an important problem faced by a radio frequency switch in design is how to minimize interference of a clock signal of an electric charge pump unit to a radio frequency system as far as possible. Consideration of circuit design from several aspects is needed, including aspects of circuit design, layout design, and the like.

It is well known that square wave signals such as working frequencies may generate signal components of harmonics of orders. Generally, harmonic components may decrease with an increase in harmonic orders. For a radio frequency system with a specific fundamental frequency range, a frequency range of the harmonic components concerned is constant. Therefore, in addition to preventing the working frequency of the electric charge pump unit from falling on 1/N (N is a positive integer, hereinafter the same) multiples of a fundamental frequency as far as possible, all the harmonic components concerned can be enabled to become lower by reducing the working frequency of the electric charge pump unit, thereby achieving an objective of reducing noise.

In actual applications, a load of the electric charge pump unit is continuously changing, in a stage in which the radio frequency system has a high requirement on noises, the radio frequency system is often operated in a stable state in which the switch is not switched and the requirement on noises imposed by the radio frequency system is the highest. In the case in which the switch is not switched, it is reflected that the load driven by the electric charge pump unit is light and that a requirement for output drive of the electric charge pump is reduced. Therefore, the working frequency of the electric charge pump unit can be reduced to reduce the noise interference to the radio frequency system generated by the clock signal of the electric charge pump unit.

On the other hand, a bias state of a transistor on a switched path needs to be changed when the radio frequency switch is switched between different paths. In this case, it is reflected that the load to be driven by the electric charge pump unit is heavy and the electric charge pump unit needs to output a larger current, resulting in a drop in a voltage on a voltage stabilizing and energy storing capacitor in the electric charge pump unit. In this way, the electric charge pump unit needs to work at a higher frequency, to keep an output voltage from dropping by an excessively large amount to affect an isolation index between different paths. It is specifically indicated that the electric charge pump unit needs to satisfy a specific speed requirement in a switch process of the radio frequency system. In addition, in a case of a same load, an output voltage establishment speed of the electric charge pump unit is in a positive relation with the working frequency of the electric charge pump unit: A high frequency indicates a high establishment speed, and a low frequency indicates a low establishment speed. In actual applications, it is also necessary to consider a requirement imposed by timing of the radio frequency system on a speed of the electric charge pump unit, and therefore the working frequency of the electric charge pump unit cannot be made excessively small.

Figure 2:
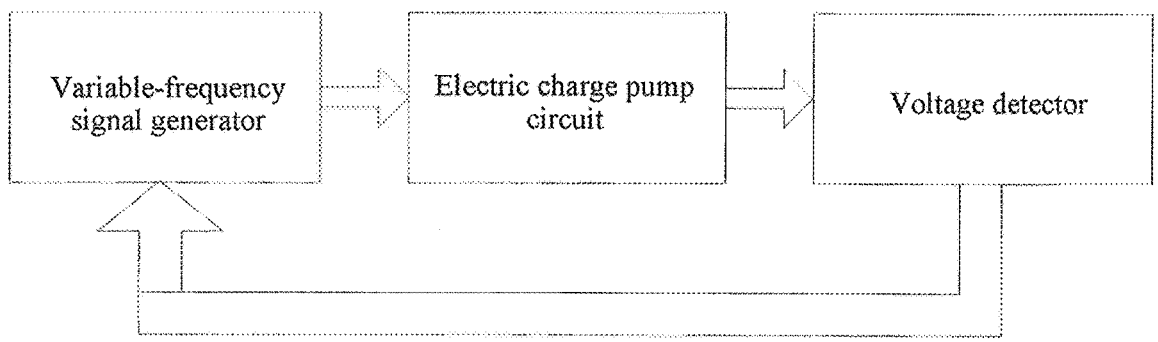
FIG. 2 is a block diagram of a variable-frequency electric charge pump unit according to the present invention.

Based on considerations of the foregoing aspects, the present invention first provides a variable-frequency electric charge pump unit, to reduce a working frequency of the electric charge pump unit as far as possible when satisfying a speed requirement of the radio frequency system for an electric charge pump. As shown in FIG. 2, the electric charge pump unit includes an electric charge pump circuit, a voltage detector, and a variable-frequency signal generator. The variable-frequency signal generator is an oscillator, one end of which serves as an output end and is connected to the electric charge pump circuit to supply an input signal, and the other end of which is connected to an output end of the voltage detector to supply a control signal input to the entire electric charge pump unit. The variable-frequency signal generator may dynamically adjust a working frequency of a clock signal based on an output of the voltage detector. The electric charge pump circuit is driven by the variable-frequency signal generator. The electric charge pump circuit uses the clock signal output by the variable-frequency signal generator to switch to charge and discharge an internal capacitor of the electric charge pump circuit, to further generate a required output voltage. The voltage may be a voltage higher than a power supply voltage (Vdd), or may also be a voltage of −Vdd. As the working frequency of an input end increases, the electric charge pump circuit enables a voltage generated and output by the electric charge pump circuit to reach a predetermined value more quickly, that is, achieves a higher establishment speed. An output end of the electric charge pump circuit is connected to the voltage detector in addition to being configured to drive a subsequent load. An input end of the voltage detector is connected to the output end of the electric charge pump circuit and the output end of the voltage detector is connected to the variable-frequency signal generator. In this way, the voltage detector adjusts the output of the voltage detector along with a value of the output voltage of the electric charge pump circuit, and then feeds back change information of the output voltage of the electric charge pump circuit to the variable-frequency signal generator, so that the variable-frequency signal generator correspondingly adjusts the working frequency, to satisfy different functional requirements for the electric charge pump unit.

It should be noted that the foregoing electric charge pump circuit can be implemented by a plurality of electric charge pump circuits in the existing technology, such as the core electric charge pump structure circuit in the background technology. The variable-frequency signal generator may be a frequency continuously variable signal generator, that is, the working frequency may be continuously changing, or may be a multipoint frequency selectable frequency signal generator, that is, the working frequency is of several relatively fixed frequency values. The foregoing voltage detector may be a resistance voltage dividing circuit, or may be a voltage-controlled resistor circuit including transistors or a voltage-controlled resistor circuit including a combination of resistors and transistors, which is not illustrated herein.

In the electric charge pump unit shown in FIG. 2, the variable-frequency signal generator is a clock signal generation circuit whose working frequency is variable. The working frequency of the clock signal generation circuit changes along with a change in the output of the voltage detector, and the voltage detector changes based on a change in the output of the electric charge pump circuit. Further, an output of the electric charge pump unit changes along with a change in the load of the electric charge pump unit. The electric charge pump unit may convert a change in the load into a change in the working frequency. The radio frequency system works in a stable non-switch state most of the time, and therefore the working frequency of the electric charge pump unit can be always kept in a relatively low state, thereby reducing noise interference generated by the electric charge pump unit to the radio frequency system.

Various implementations of the electric charge pump unit are specifically described below through specific embodiments:

Embodiment 1

Figure 3:
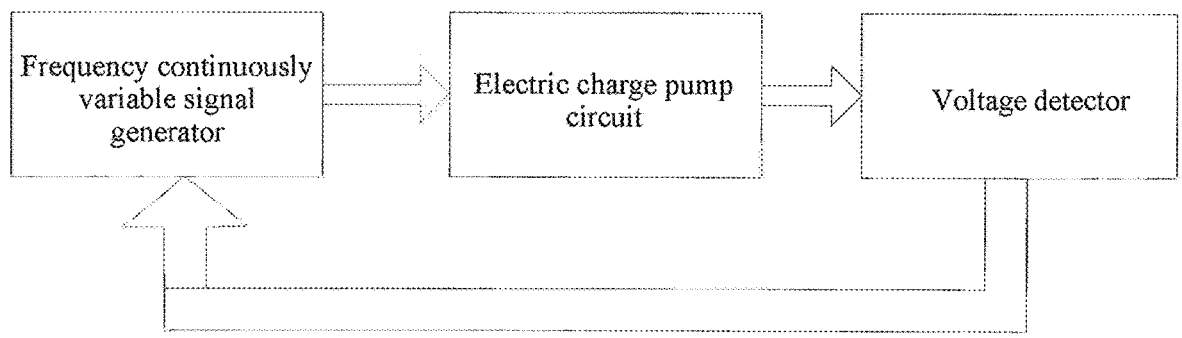
FIG. 3 is a block diagram of an electric charge pump unit according to Embodiment 1 of the present invention.

FIG. 3 is an overall block diagram of an electric charge pump unit according to Embodiment 1 of the present invention. In this embodiment, the variable-frequency signal generator uses a signal generator whose frequency is continuously variable (a frequency continuously variable signal generator shown in the figure), and the electric charge pump circuit is an electric charge pump circuit capable of generating a negative voltage Vneg. In an embodiment of the present invention, the frequency continuously variable signal generator may be implemented by a common voltage controlled oscillator (VCO).

In the embodiment shown in FIG. 3, continuous switches of the radio frequency switch by the radio frequency system is reflected in continuous changes in a voltage of the electric charge pump circuit. The voltage of the electric charge pump circuit is connected to the load and also supplied to the voltage detector, and the voltage detector detects a change in the load by detecting the voltage of the electric charge pump circuit. The output of the voltage detector is connected to a frequency continuously variable signal generator as an input control voltage for the latter. An output frequency of the frequency continuously variable signal generator is correlated to the input control voltage thereof, and may be expressed as:

$$Fc=f(V).$$

Figure 4:
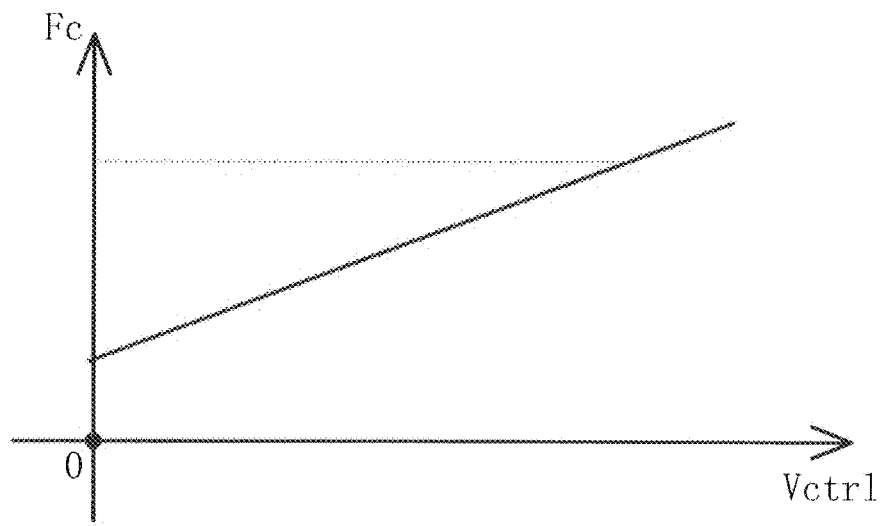
FIG. 4 is a schematic diagram of a relationship between an output frequency and an input control voltage.

That is, the output frequency Fc of the frequency continuously variable signal generator may be a function of the output voltage V of the voltage detector. FIG. 4 is a schematic diagram of a relationship between an output frequency and an input control voltage. It can be learned from FIG. 4 that the output frequency is continuously variable.

Figure 5:
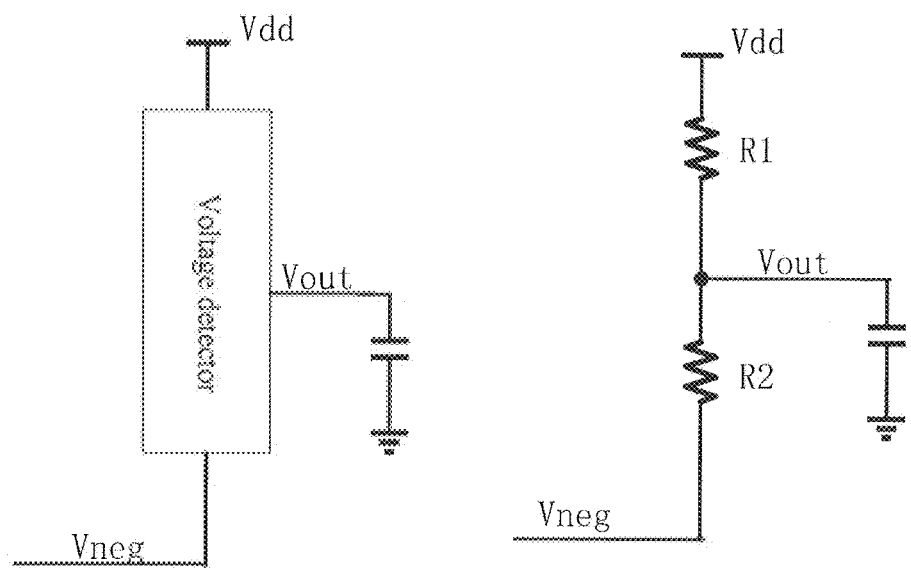
FIG. 5 is a principle diagram of a voltage divider circuit used by an electric charge pump circuit with a negative voltage demand.

FIG. 5 is a principle diagram of a voltage divider circuit used by an electric charge pump circuit with a negative voltage demand. When the load is heavy, an output voltage Vneg of the electric charge pump circuit increases (a trend of changing from a voltage lower than 0 V to 0 V), and an output voltage Vout of the corresponding voltage detector increases, so that an input control voltage Vctrl of the frequency continuously variable signal generator also increases. As a result, an oscillation frequency of the frequency continuously variable signal generator increases, to speed up a working frequency of the electric charge pump circuit and try to pump charges in a negative voltage direction for the output voltage Vneg, to finally suppress a rising trend of the output voltage Vneg caused by the increase in the load, thereby maintaining stability of the voltage of the electric charge pump circuit. In view of the above, the electric charge pump unit provided in Embodiment 1 is a negative feedback closed loop system: The process from the change in the load to the adjustment of the working frequency of the electric charge pump is an autonomous process.

When the radio frequency system completes the switch and enters a stable operating stage and the load driven by the electric charge pump unit becomes light, the output voltage Vneg reaches a predetermined negative voltage value, and at the same time the output Vout of the voltage detector also drops along with the drop of the output voltage Vneg, so that the output frequency of the frequency continuously variable signal generator is reduced and the noise interference of the frequency continuously variable signal generator to the radio frequency system is finally reduced.

Embodiment 2

Figure 6:
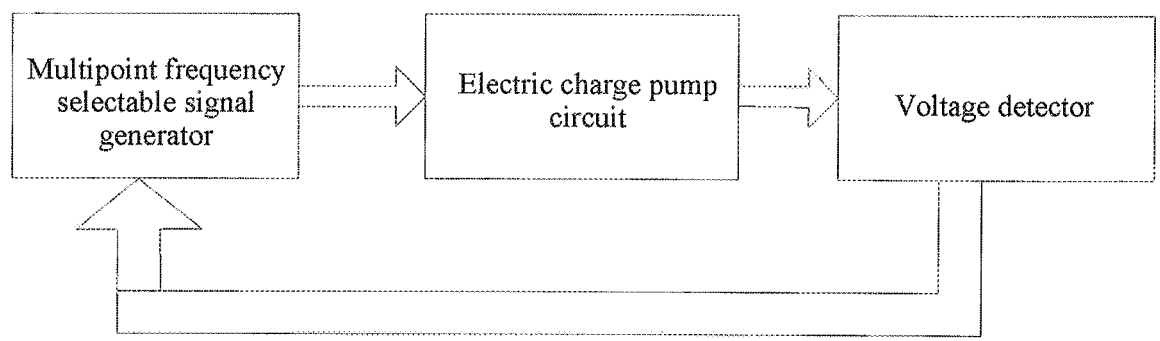
FIG. 6 is an overall block diagram of an electric charge pump unit according to Embodiment 2 of the present invention.

FIG. 6 is an overall block diagram of an electric charge pump unit according to Embodiment 2 of the present invention. In Embodiment 2, the variable-frequency signal generator used is a multipoint frequency selectable signal generator. That is, a control voltage value input by the signal generator is determined by comparison to select some specific frequencies output by the signal generator. In an embodiment of the present invention, the variable-frequency signal generator may be implemented by an oscillator circuit including a frequency divider.

Figure 7:
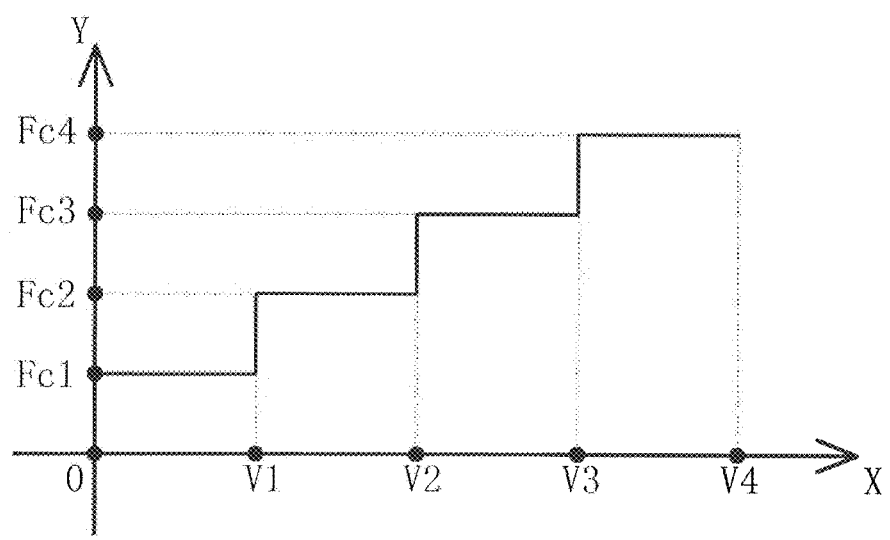
FIG. 7 is a schematic diagram of a relationship between a multipoint frequency selectable output and a control signal.

In Embodiment 2, an example in which the electric charge pump circuit is an electric charge pump circuit capable of generating a negative voltage Vneg is also used. Continuous switches of a radio frequency switch by a radio frequency system is reflected in continuous changes in a voltage of the electric charge pump circuit. The voltage of the electric charge pump circuit is provided for a voltage detector when being connected to a load and the voltage detector detects a change in the load by detecting the voltage of the electric charge pump circuit. An output of the voltage detector is connected to a multipoint frequency selectable signal generator to serve as an input control voltage for the latter. FIG. 7 is a schematic diagram of a relationship between a multipoint frequency selectable output and a control signal. It can be learned from FIG. 7 that the output frequency may be some frequency points, such as Fc1 and Fc2, set in advance. Based on the correspondence shown in FIG. 7, a corresponding output frequency of the variable-frequency signal generator can be selected based on a control voltage value.

The same as the working process of Embodiment 1: When the load is heavy, an output voltage Vneg of the electric charge pump circuit increases (a trend of changing from a voltage lower than 0 V to 0 V), and an output voltage Vout of the corresponding voltage detector increases, so that an input control voltage Vctrl of the variable-frequency signal generator also increases, for example, increases from V1 to V4 in FIG. 7, to further select a higher oscillation frequency, Fc4, of the variable-frequency signal generator as an output, to speed up a working frequency of the electric charge pump circuit and try to pump charges in a negative voltage direction for the output voltage Vneg, to finally suppress a rising trend of the output voltage Vneg caused by the increase in the load, thereby maintaining stability of the voltage of the electric charge pump circuit. In view of the above, the electric charge pump unit provided in Embodiment 2 is also a negative feedback closed loop system: The process from the change in the load to the adjustment of the working frequency of the electric charge pump is an autonomous process.

When the radio frequency system completes the switch and enters a stable operating stage and the load driven by the electric charge pump unit becomes light, the output voltage Vneg reaches a predetermined negative voltage value, and at the same time the output Vout of the voltage detector also drops along with the drop of the output voltage Vneg, so that the output frequency of the multipoint frequency selectable signal generator is reduced and the noise interference of the multipoint frequency selectable signal generator to the radio frequency system is finally reduced.

It should be further noted that another advantage of Embodiment 2 is: by setting proper fixed frequency points Fc1, Fc2, . . . , a frequency point of a multiplied-frequency of the working frequency of the electric charge pump unit can be prevented from falling on frequency points of harmonics of orders of a fundamental frequency of the radio frequency system, thereby avoiding frequency mixing interference.

Embodiment 3

Figure 8:
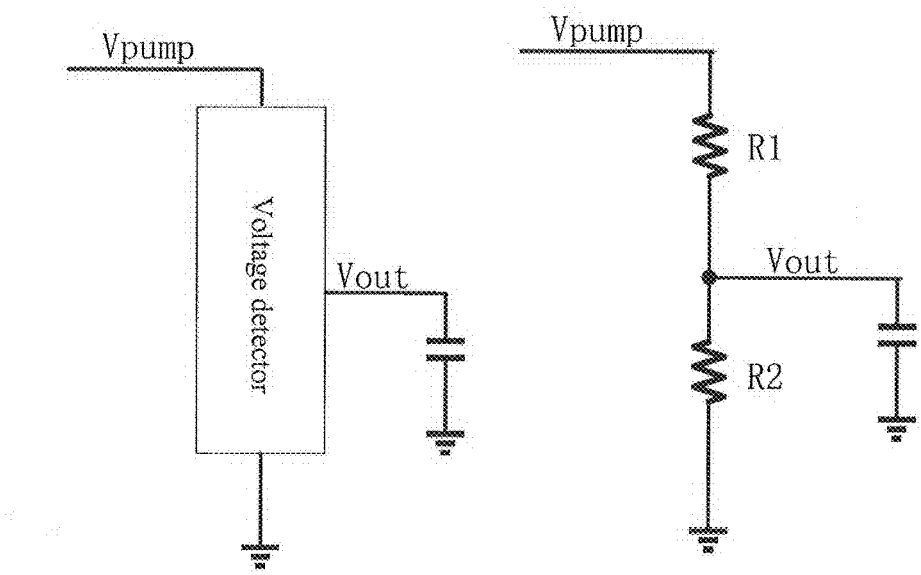
FIG. 8 is a principle diagram of a voltage divider circuit used by an electric charge pump circuit with a boosted voltage demand.

FIG. 8 is a principle diagram of a voltage divider circuit used by an electric charge pump circuit with a boosted voltage demand. The voltage divider circuit is used in Embodiment 3 of the present invention. As shown in FIG. 8, a gate voltage Vg of a transistor on a path can be boosted to a voltage level higher than Vdd by using a voltage boost electric charge pump circuit, for example, Vpump (Vpump>Vdd). Further, a conductive resistance of the transistor on the path can be further reduced, to reduce an insertion loss of the radio frequency switch.

In Embodiment 3, with continuous switches of the radio frequency switch, the output of the electric charge pump circuit decreases correspondingly due to the increase in the load, and in this case, the output Vout of the voltage detector also decreases. A working mode Fc=f(V) of the variable-frequency signal generator is different from that of Embodiment 1 and Embodiment 2 described above. That is, with the drop of the input control voltage V, the output frequency Fc, on the contrary, needs to increase, to speed up the working frequency of the electric charge pump circuit and to correspondingly speed up a rise of Vpump, so as to satisfy a speed requirement of the radio frequency switch during switch. However, in a stable operation state in which the switch is not switched, the Vpump only needs to be maintained at a specific voltage level and does not need to perform a reversed charge and discharge process on the load, and therefore, the load is light. In this way, the variable-frequency signal generator can reduce the working frequency, thereby reducing the noise interference of the variable-frequency signal generator to the radio frequency system.

Figure 9:
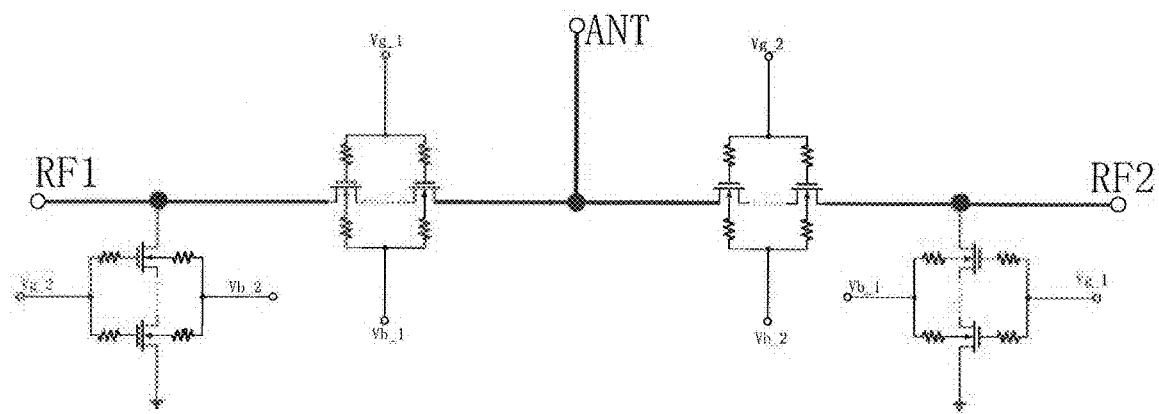
FIG. 9 is an exemplary diagram showing that an electric charge pump unit drives a load according to the present invention.

An effect of the load status on the working process of the electric charge pump unit is further described below with reference to FIG. 9. FIG. 9 is an example showing that an electric charge pump unit drives a load according to the present invention, and shows a single-pole double-throw (SP2T) switch circuit implemented by a transistor. As described above, the radio frequency system has a requirement on isolation between different paths of the radio frequency switch. In this case, the electric charge pump circuit usually needs to generate a negative voltage to bias off a gate (Vg) and a substrate (Vb) of a transistor on a path by using the negative voltage, to reach an index requirement on the isolation between different paths of the radio frequency switch.

In the embodiment shown in FIG. 9, the working principle is described simply by using a state in which a path from ANT to RF1 is turned on and a path from ANT to RF2 is turned off as an example. In this case, a bias condition of a transistor on the paths is:

$Vg1=Vdd, Vb1=0$ V; and $Vg2=Vb2=-Vdd.$

The foregoing −Vdd needs to be generated by the electric charge pump unit provided in the present invention. The main objective of introducing the −Vdd herein is to thoroughly turn off all the transistors that are on the path from ANT to RF2 and to be turned off, so as to improve the isolation.

When an on/off state is switched, by using a case in which the path from ANT to RF1 is switched from an on state to an off state and the path from ANT to RF2 is switched from an off state to an on state as an example, the control signal needs to generate the following conversion:
converting Vg1 from Vdd into −Vdd;
converting Vb1 from 0 V into −Vdd;
converting Vg2 from −Vdd into Vdd; and
converting Vb2 from −Vdd into 0 V.

The output end of the electric charge pump unit needs to provide a stronger driving capability, so as to rapidly complete the conversion from Vg1 and Vb1 to the voltage −Vdd. In other words, in this case, the electric charge pump unit needs to charge and discharge a subsequent circuit node quickly, and the load is heavy.

Further, FIG. 9 merely shows a simple form of driving the load by the electric charge pump unit according to the present invention. In actual applications, the load of the electric charge pump unit is often a switch array much greater than the single-pole double-throw switch. In this way, the number of nodes that need to change the voltage from Vdd or 0 V to −Vdd may be much larger in the on/off switching process, and therefore the requirement for the output drive of the electric charge pump unit becomes higher. Therefore, the electric charge pump unit provided in the present invention performs driving by using a variable-frequency signal generator. When the requirement for the electric charge pump unit to drive the load increases in an actual application scenario, the working frequency of the variable-frequency signal generator increases correspondingly, so that the electric charge pump unit outputs a larger driving current/higher driving voltage, to satisfy the actual demands for driving the load. When the radio frequency switch works in a stable state, that is, the radio frequency switch is not switched, the electric charge pump unit merely needs to maintain an existing state of the output voltage −Vdd, which is reflected that the subsequent load is relatively light and the electric charge pump unit does not need to output a quite large driving current. In this case, the working frequency of the variable-frequency signal generator is reduced correspondingly, so as to reduce noise interference of the electric charge pump unit to the radio frequency system.

In view of the above, the variable-frequency electric charge pump unit provided in the present invention can dynamically adjust the working frequency of the variable-frequency signal generator on the basis of a requirement that a radio frequency system work state has on the driving output of the electric charge pump unit, thus satisfying the actual demands for driving the load as required and reducing noise interference to the radio frequency system.

Based on the foregoing electric charge pump unit, the present invention further provides a method for controlling a radio frequency switch. In the method for controlling a radio frequency switch, a radio frequency switch control voltage is generated by using an electric charge pump unit including a clock signal; a value of the radio frequency switch control voltage is detected by using a voltage detection circuit; and a frequency of the clock signal is adjusted based on an output signal of the voltage detection circuit.

An output voltage of the voltage detection circuit varies monotonically and in a same direction with a negative voltage generated by the electric charge pump unit. The frequency of the clock signal continuously varies monotonically and in a same direction with an output voltage of the voltage detection circuit. Alternatively, the frequency of the clock signal discretely varies monotonically and in a same direction with an output voltage of the voltage detection circuit. The output voltage of the voltage detection circuit is a high level or low level logic signal, and the frequency of the clock signal is correspondingly a high frequency or a low frequency.

The electric charge pump unit shown in the foregoing embodiments can be used in a chip (for example, a radio frequency switch chip). The electric charge pump unit in the radio frequency switch chip is not described in detail again herein.

In addition, the foregoing electric charge pump unit may further be used in a communication terminal and serve as a significant component of a radio frequency circuit. The communication terminal described herein refers to a computer device capable of being used in a mobile environment and supporting various communications standards such as GSM, EDGE, TD_SCDMA, TDD_LTE, and FDD_LTE, including but not limited to, a mobile phone, a notebook computer, a tablet computer, an in-vehicle computer, or the like. In addition, the electric charge pump unit is also applicable to other radio frequency circuit application scenarios, such as a communication base station compatible with various communications standards, which is not described in detail herein.

The variable-frequency electric charge pump unit, chip, and communication terminal provided in the present invention are described in detail above. For a person of ordinary skill in the art, any obvious changes made thereto without departing from the essential spirit of the present invention will constitute an infringement of the patent right of the present invention, and will bear the corresponding legal liability.

What is claimed is:

1. A variable-frequency electric charge pump unit, comprising a variable-frequency signal generator, an electric charge pump circuit, and a voltage detector that are sequentially connected, wherein
the variable-frequency sequence generator is implemented by a multipoint frequency selectable oscillator circuit;
the variable-frequency signal generator outputs a clock signal to the electric charge pump circuit, the electric charge pump circuit generates an output voltage based on the clock signal, and the output voltage on one hand drives a load and on the other hand is connected to the voltage detector; and
an output end of the voltage detector is connected to the variable-frequency signal generator;

when the load of the electric charge pump unit increases, the working frequency of the variable-frequency signal generator increases correspondingly; and when the load of the electric charge pump unit decreases, the working frequency of the variable-frequency signal generator decreases correspondingly.

2. The electric charge pump unit according to claim 1, wherein
the variable-frequency signal generator dynamically adjusts a working frequency of the clock signal based on an output of the voltage detector.

3. The electric charge pump unit according to claim 1, wherein
a frequency point of a multiplied-frequency of the working frequency is prevented from falling on frequency points of harmonics of orders of a fundamental frequency.

4. The electric charge pump unit according to claim 1, wherein
the electric charge pump circuit raises a gate voltage of a transistor on a path to a voltage level greater than a power supply voltage, to reduce an insertion loss of a radio frequency switch.

5. The electric charge pump unit according to claim 1, wherein
the electric charge pump circuit generates a negative voltage, to bias off a gate and a substrate of a transistor on a path.

6. A method for controlling a radio frequency switch, comprising the following steps:
generating, by using the electric charge pump unit according to claim 1, a radio frequency switch control voltage;
detecting, by a voltage detection circuit, a value of the radio frequency switch control voltage; and
adjusting a frequency of a clock signal based on an output signal of the voltage detection circuit.

7. The method for controlling a radio frequency switch according to claim 6, wherein
an output voltage of the voltage detection circuit varies monotonically and in a same direction with a negative voltage generated by the electric charge pump unit.

8. The method for controlling a radio frequency switch according to claim 6, wherein
the frequency of the clock signal continuously varies monotonically and in a same direction with an output voltage of the voltage detection circuit.

9. The method for controlling a radio frequency switch according to claim 8, wherein
the frequency of the clock signal discretely varies monotonically and in a same direction with an output voltage of the voltage detection circuit.

10. The method for controlling a radio frequency switch according to claim 9, wherein
the output voltage of the voltage detection circuit is a high level or low level logic signal, and the frequency of the clock signal is correspondingly a high frequency or a low frequency.

11. A chip having an electric charge pump unit, wherein the chip comprises the electric charge pump unit according claim 1.

* * * * *